United States Patent [19]
Johnson et al.

[11] Patent Number: 6,043,990
[45] Date of Patent: Mar. 28, 2000

[54] MULTIPLE BOARD PACKAGE EMPLOYING SOLDER BALIS AND FABRICATION METHOD AND APPARATUS

[75] Inventors: Morgan T. Johnson, Portland; David R. Ekstrom, Oregon City, both of Oreg.

[73] Assignee: Prototype Solutions Corporation, Beaverton, Oreg.

[21] Appl. No.: 08/871,085

[22] Filed: Jun. 9, 1997

[51] Int. Cl.[7] .......................... B23K 31/02; B23K 37/04; H05K 1/11

[52] U.S. Cl. ......................... 361/803; 361/790; 228/6.2; 228/44.7; 228/180.22; 228/212

[58] Field of Search ................. 228/180.22, 189, 228/212, 6.2, 44.7; 361/744, 772, 773, 777, 779, 790, 803; 257/738, 780

[56] References Cited

U.S. PATENT DOCUMENTS

| | | | |
|---|---|---|---|
| 3,516,155 | 6/1970 | Smith | 228/44.7 |
| 4,803,450 | 2/1989 | Burgess et al. . | |
| 5,046,238 | 9/1991 | Daigle et al. . | |
| 5,128,831 | 7/1992 | Fox, III et al. . | |
| 5,147,084 | 9/1992 | Behun et al. . | |
| 5,262,925 | 11/1993 | Matta et al. | 361/783 |
| 5,367,764 | 11/1994 | Distefano et al. . | |
| 5,410,805 | 5/1995 | Pasch et al. . | |
| 5,456,004 | 10/1995 | Swamy . | |
| 5,474,458 | 12/1995 | Vafi et al. . | |
| 5,477,933 | 12/1995 | Nguyen . | |
| 5,479,703 | 1/1996 | Desai et al. . | |
| 5,495,397 | 2/1996 | Davidson et al. . | |
| 5,572,405 | 11/1996 | Wilson et al. . | |
| 5,576,519 | 11/1996 | Swamy . | |
| 5,591,941 | 1/1997 | Acocella et al. . | |
| 5,598,036 | 1/1997 | Ho . | |
| 5,618,189 | 4/1997 | Jin et al. . | |
| 5,736,790 | 4/1998 | Iyogi et al. | 257/780 |
| 5,801,446 | 9/1998 | DiStefano et al. | 257/738 |

FOREIGN PATENT DOCUMENTS

| | | | |
|---|---|---|---|
| 84464 | 7/1983 | European Pat. Off. | 257/780 |
| 2-268487 | 2/1990 | Japan . | |
| 4-280695 | 6/1992 | Japan . | |
| 7-202418 | 8/1995 | Japan . | |
| 7-245480 | 9/1995 | Japan . | |
| 96/37089 | 11/1996 | WIPO | 228/180.22 |

OTHER PUBLICATIONS

*IBM Technical Disclosure Bulletin;* vol. 36, No. 12, Dec. 1993, p. 669.
*IBM Technical Disclosure Buleltin;* vol. 8, No. 10, Mar. 1966, p. 1325–1326.
*Microelectronics Packaging Handbook.* Ed. Tummala, Rao R. and Eugene J. Rymaszewski. New.
Ball Grid Array Technology. Ed. Lau, John H. New York City: McGraw–Hill, Inc., 1995 (56–57).
*Surface Mount Technology.* vol. 11, No. 6, Jun. 1997. pp.44–45, 66–68, 77–79.

*Primary Examiner*—Patrick Ryan
*Assistant Examiner*—Jeffrey T. Knapp
*Attorney, Agent, or Firm*—Birdwell & Janke, LLP

[57] ABSTRACT

A multiple circuit board package employing solder balls and method and apparatus for fabricating same is described. Two or more printed circuit boards and a plurality of electronic devices are joined together using solder balls. Alternatively, three or more printed circuit boards are joined together using the solder balls. A novel and improved solder ball connection is disclosed, along with a fixture for aligning and fixing the disposition of the pads and the solder balls during a heating cycle in which the circuit boards are placed under pressure while the solder balls are re-flowed for making an electrical connection.

31 Claims, 7 Drawing Sheets

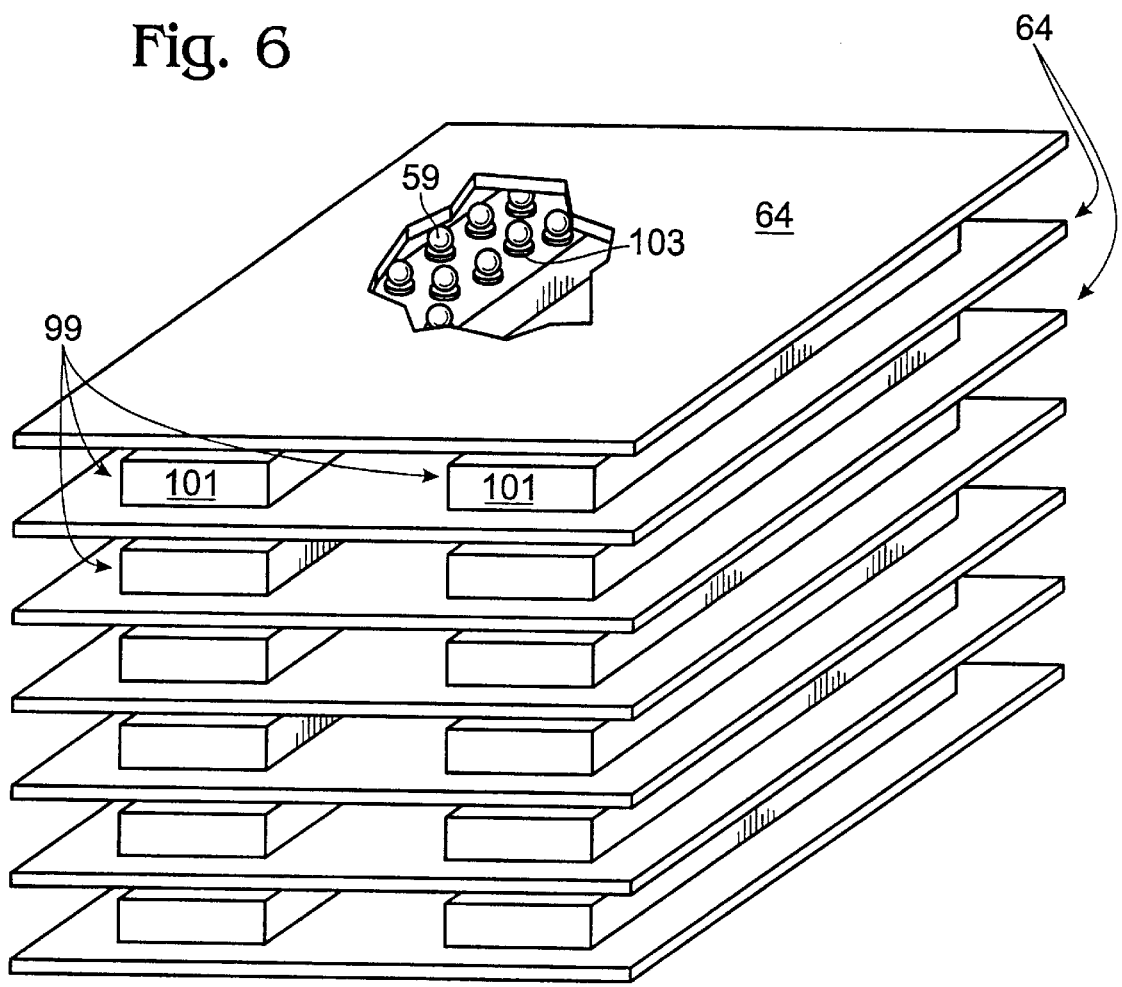

MULTIPLE BOARD PACKAGE EMPLOYING SOLDER BALLS AND FABRICATION METHOD AND APPARATUS

BACKGROUND OF THE INVENTION

This invention relates to a multiple circuit board package employing solder balls and fabrication method and apparatus, particularly for the fabrication of high density, multi-layered electronic circuit packages, and more particularly second tier packages of a plurality of multi-layer circuit boards.

In the electronics industry, particularly in the prototyping of large scale integrated circuits, there is a need for interconnecting electronic devices, such as integrated circuit packages, packaged integrated circuits, and discrete devices, in highly dense packaging so as to reduce signal path lengths and overall size. It has long been a practice to fabricate a multi-layered circuit board having layers of distinct circuit patterns separated by insulating material such as fiberglass or ceramic and interconnected by "vias" through the board, that is, holes drilled through the board and plated with metal. The electronic devices are mounted on a surface of the board and connected to a circuit pattern thereon at pads, which are usually larger than the rest of the pattern to accept the leads or contacts of the electronic device. Multi-layered circuit boards are shown, for example, in DiStefano et al. U.S. Pat. No. 5,376,764, and Swamy U.S. Pat. No. 5,576,519, herein incorporated by reference in its entirety.

There is a practical limit to the number of layers that can be provided in a multi-layered circuit board, and a concomitant limit to the number of interconnections that can be made between electronic devices with such circuit boards. This is because, as a board becomes thicker with additional layers of circuit patterns, it becomes increasingly difficult to place vias in the board and the board fabrication yield drops. Vias are placed by drilling holes in the multi-layered board. The deeper the via, the more drill bit wander that is produced when holes are drilled, which produces a non uniform and usually expanding hole progressively through the via. This increases the hole size tolerance, thereby reducing the possible circuit density, and makes plating the inside of the vias more difficult. Indeed, surface tension of the plating metal makes it very difficult to uniformly plate the interior of a via having a high aspect ratio, that is, the ratio of the via depth to the diameter of the via opening. Expensive precision drilling machinery is required and, even then, one must accept a relatively low likelihood of producing a useful board.

The aforementioned problems with multi-layered circuit boards are particularly disadvantageous in constructing prototypes of large scale circuits. By their nature, prototypes are experimental and usually subject to change. As signal path lengths are often a significant factor in circuit operation, it is usually desirable to make the prototype board as compact as possible. Fabricating prototypes with multi-layered circuit board technology alone is both expensive, due to the inherently costly process, the need to redo the entire board to make a change and low yield, and limited in its ability to minimize signal path lengths.

Combinations of multi-layered circuit boards have previously been proposed for overcoming the aforementioned problem of fabricating multi-layered boards with many layers in Swamy U.S. Pat. Nos. 5,456,004 and 5,576,519. These patents propose interconnecting a plurality of multi-layer circuit boards with interconnect sheets having solder placed in sheet vias at interconnect locations. However, this requires an additional interconnect sheet fabrication process.

Combinations of multi-layered circuit boards have also been proposed for achieving three dimensional circuit packaging in Davidson et al. U.S. Pat. No. 5,495,397. However, this requires an additional circuit board for mounting and maintaining the spacing of the multi-level circuit boards.

Small scale multi-layered circuit boards have also been used to package individual electronic circuit devices for mounting on another, larger scale multi-level circuit board, sometimes using ball grid array technology ("solder balls"), as shown, for example, in Nguyen U.S. Pat. No. 5,477,933. While this straightforward combination of multi-layered circuit boards and solder balls is effective on a small scale, that is, with relatively few interconnections, it cannot produce high yields and reliable packages on a large scale. This is because, when large scale multi-layered circuit boards are simply joined together using solder balls, the variations in spacing over the surface area of the boards often cause many of the connections to spread out and short, yet leaves open many locations where a connection was to be made.

Solder balls have typically been used to mount chip carriers to circuit boards, as shown for example in Wilson et al. U.S. Pat. No. 5,572,405 and Acocella et al. U.S. Pat. No. 5,591,941. Often, the solder balls used are of the type having a high melting point core, typically made of copper, and a low melting point exterior made of solder. Use of solder balls having high melting point cores increases the likelihood that, when the solder is melted to wet the circuit pads, a connection will be made without causing so much solder to flow as to produce a short. However, even the use of solder balls with high melting point cores does not overcome the high probability of opens in attempting to make large scale packages of multi-layered circuit boards. Also, where there are many interconnections between boards, misalignments of the boards often cause movement of the solder balls when the boards are placed together, leading to failed connections.

Therefore, there is a need for an improved multiple circuit board package employing solder balls and a fabrication method and apparatus.

SUMMARY OF THE INVENTION

The multiple circuit board package employing solder balls and fabrication method and apparatus of the present invention solves the aforementioned problems and meets the aforementioned need by forming a multi-layered board from two or more standard printed circuit boards having electrical interconnect patterns and including respective contact surfaces electrically connected thereto. The method comprises disposing, on selected contact surfaces of a first of the boards, a planar array of solder balls with high melting point cores as known in the art, placing a second board over the first board so that selected contact surfaces of the second board contact the solder balls, heating the assembly to melt the solder balls and thereby wet the contact surfaces while applying uniform external pressure thereto, and cooling the assembly to solidify the solder for making a rigid electrical connection between the boards. Solder balls with high melting point cores provide minimum spacing between the boards for electrically isolating the boards, while the external pressure ensures that the boards will have a maximum separation.

The boards may or may not have electronic devices installed thereon. Where electronic devices are installed, the melting temperature of the solder balls may be selected to be lower than the melting temperature of the solder employed to connect the electrical devices. Electronic devices may disposed on either side of a board to which they are connected.

In effect, placing solder balls between boards, heating and cooling the boards to solidify connections between the boards through the solder balls while applying external pressure replaces the prior art process of laminating the boards, drilling the boards, and plating the drilled holes. The cost is low and tends to increase only linearly with the number of boards. For producing a multi-layer board having a large number of layers, the savings can be very dramatic. Related and other advantages of the method and apparatus are (1) higher density interconnect patterns may be employed; (2) loaded circuit boards may be joined with the method, which permits a higher level testing at an earlier stage of manufacturing and thereby reduces scrap and rework; (3) the method permits a mass produced and standard interconnect scheme that may take advantage of economies of scale; and (4) the method permits the rapid and inexpensive changing of interconnect patterns for optimizing circuit performance.

More than two boards may be stacked and soldered together to realize the advantages of the concept by employing a circuit board having first contacts on one side of the board and second contacts on the other side of the board, for stacking a second circuit board and a third circuit board with the aforementioned solder balls disposed between the first contacts and contacts of the second board, and between the second contacts and contacts of the third board.

A fixture is provided for aligning the boards to be joined and for applying uniform pressure to force the boards toward one another. The fixture is adapted to function during the heating cycle to which the boards are treated for forming the solder connections.

Therefore, it is a principal object of the present invention to provide a novel and improved multiple circuit board package and fabrication method and apparatus.

It is another object of the present invention to provide such a method and apparatus that provides for forming a multiple circuit board package having three or more standard printed circuit boards.

It is yet another object of the present invention to provide such a method and apparatus that provides for forming a multiple board package having two or more standard printed circuit boards and a plurality of electrical devices electrically interconnected to at least one of the boards.

It is still another object of the present invention to provide such a method and apparatus that provides for significantly decreased cost in the fabrication of a printed circuit board package.

It is a further object of the present invention to provide such a method and apparatus that provides for significantly decreased cost and turn-around time in prototyping and repair of loaded printed circuit board packages.

It is yet a further object of the present invention to provide such a method and apparatus that provides for a novel and improved solder ball connection between a pair of circuit board pads.

It is still a further object of the present invention to provide such a method and apparatus that provides for increased predictability and reliability of solder joints formed with solder balls.

It is another object of the present invention to provide such a method and apparatus that provides for fabricating completely a multiple board package in a standard printed circuit assembly shop.

The foregoing and other objects, features and advantages of the present invention will be more readily understood upon consideration of the following detailed description of the invention, taken in conjunction with the following drawings.

BRIEF DESCRIPTION OF THE DRAWINGS

FIG. 6 is a partially cut-away pictorial view of a multiple board package having a three-dimensional configuration according to the present invention.

DETAILED DESCRIPTION OF A PREFERRED EMBODIMENT

Figure 1:
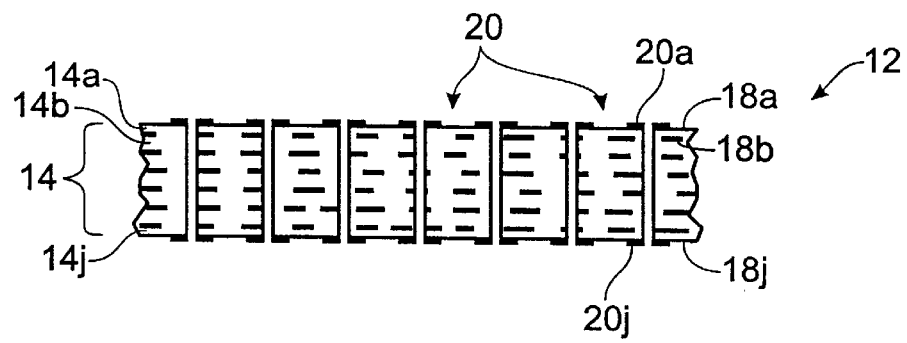
FIG. 1 is a cross section of a prior art multi-layer circuit board.
Figure 2:
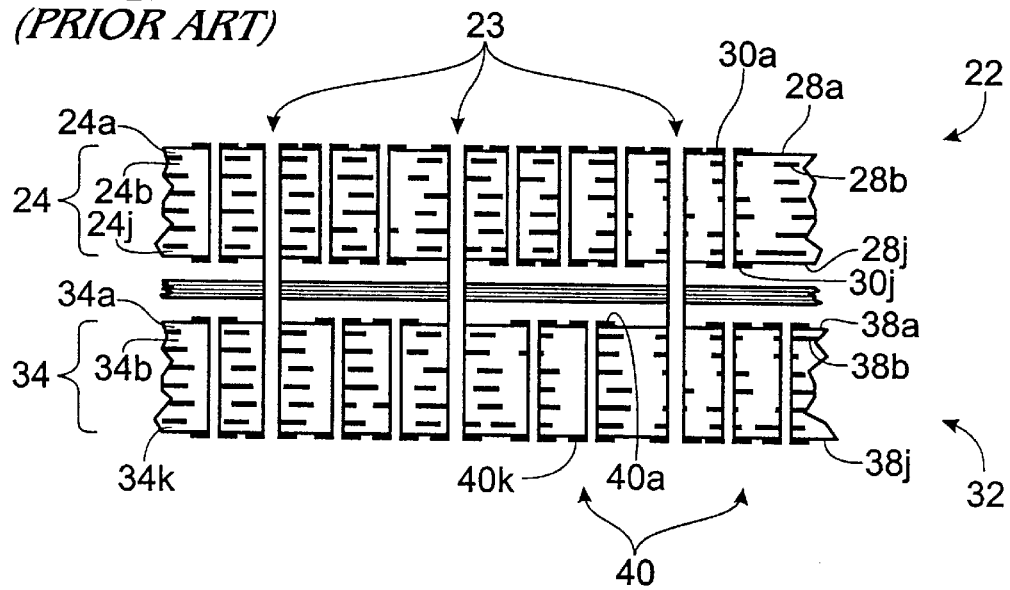
FIG. 2 is a cross section of a prior art package of two multi-layer circuit boards laminated together.

Referring to FIGS. 1–2, circuit boards have heretofore been formed to incorporate a plurality of layers in one of two ways. As illustrated in FIG. 1, the traditional method for forming a multi-layer circuit board 12 has been to laminate together individual layers 14 of fiberglass substrate material, the structure comprising the individual layers 14a, 14b, . . . 14j, where j is equal to the total number of layers in the board 12. Each layer 14 includes on at least one side of the layer an associated circuit pattern 18, respectively referenced 18a, 18b, . . . 18j. The circuit patterns have an associate plurality of interconnect pads 20, respectively referenced 20a, 20b, . . . 20j.

After lamination, the board 12 is drilled through at selected locations which intercept selected pads 20 of one, two or more of the layers, the holes being plated to provide electrical continuity therebetween.

One problem with the traditional method and structure is that the aforedescribed process requires expensive processing equipment, including the equipment to fabricate the individual layers 14, laminate the layers, and precision drill through the pads 20 of the layers. The typical printed circuit board manufacturing shop is highly specialized and, unless volumes are high, very expensive.

Another problem with the traditional method is that the resulting board 12 must incorporate the tolerances of the process. An important tolerance is required by the drill bit as a result of drill bit wander. As the thickness of the board 12 increases, lateral bending of the drill bit causes the location of the drilled hole at the bottom of the board to vary from a desired, central location at the top of the board by a distance that increases with the thickness, assuming drilling commencing from the top of the board. Therefore, as the number j of layers 14 increases, the size of the pads 20 of consecutively more distant bottom layers must increase in order to assure that the drill bit will penetrate them. The larger pads require more space on the board and, therefore, decrease the space that can be devoted to the interconnect pattern. For a given interconnect requirement, decreasing the amount of available board space to accommodate the interconnect pattern places stricter requirements on the fabrication of the interconnect pattern, or requires more layers, each of which increases cost.

Another important tolerance is required by the plating process. When the thickness of the board 12 increases, the hole size must increase in order to allow plating through the increased length of the hole. An increased hole size requirement has the same effect as does the aforementioned increase of the size of the pads 20 due to drill wander. As a result of the above, the cost to manufacture the board 12 in the traditional manner is relatively low for a small number of layers, but increases substantially geometrically with the number of layers. Accordingly, for a very large number of layers, the cost of the board 12 manufactured as aforedescribed may be prohibitive.

Referring to FIG. 2, the prior art has recognized the above difficulties in the board 20 as illustrated. The method for forming the board 20 is to employ two boards 22, 32 formed in the traditional manner. That is, for the board 22, individual layers 24 of fiberglass substrate material are laminated together, the structure comprising the individual layers 24a, 24b, . . . 24j, where j is equal to the total number of layers in the board 22. Each layer 24 includes on at least one side of the layer an associated circuit pattern 28, respectively referenced 28a, 28b, . . . 28j. The circuit patterns have an associate plurality of interconnect pads 30, respectively referenced 30a, 30b, . . . 30j.

Similarly, for the board 32, individual layers 34 of fiberglass substrate material are laminated together, the structure comprising the individual layers 34a, 34b, . . . 34k, where j is equal to the total number of layers in the board 22. Each layer 34 includes on at least one side of the layer an associated circuit pattern 38, respectively referenced 38a, 38b, . . . 38k. The circuit patterns have an associate plurality of interconnect pads 40, respectively referenced 40a, 40b, . . . 40j.

After each of the boards 22, 32 are separately laminated, each is drilled through at selected locations which intercept selected pads 30, 40 respectively, of one, two or more of the layers, the holes being plated to provide electrical continuity therebetween, also in the traditional manner. The aforementioned problems related to the thickness of the board being drilled and plated arise in construction of the boards 22, 32; however, only to the extent of the thickness thereof.

Next, the two boards 22, 32 are laminated together in an additional lamination step, and an additional drilling and plating step is performed to interconnect the boards wherein additional holes 23 are drilled through the thicknesses of both boards. The disadvantages described above attach to these holes; however, there are fewer of them than there would otherwise be, minimizing though not eliminating the problem.

Figure 3:
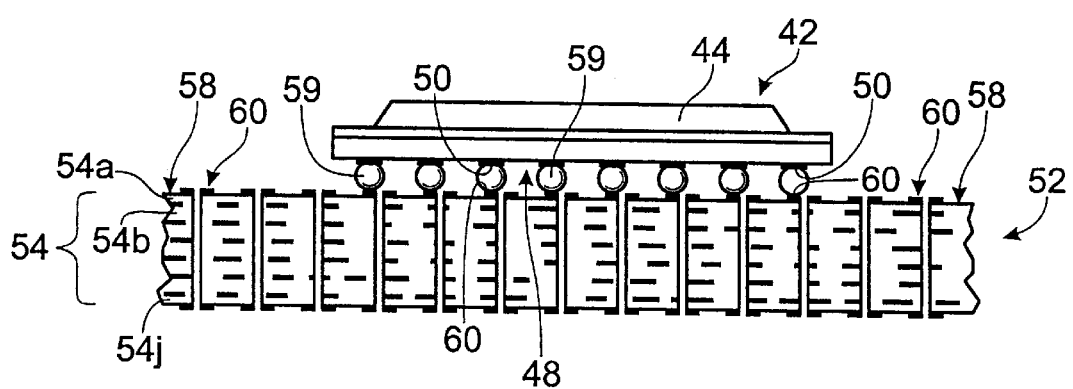
FIG. 3 is a cross section of a prior art package comprising an electronic device mounted on a multi-layer circuit board mounted with solder balls.

Referring to FIG. 3, a prior art method for joining an electronic device 42 to a circuit board 52 is illustrated. The electronic device 42 generally has an operating portion 44 and a circuit pattern 48, the circuit pattern having an associated plurality of interconnect pads 50 for interconnecting to the operating portion. The circuit board 52 typically comprises individual layers 54 of fiberglass substrate material: 54a, 54b, . . . 54j, where j is equal to the total number of layers in the board 52. On a top-most layer 54a, the board 52 includes an associated circuit pattern 58 having interconnect pads 60, some of which are adapted for receiving the pads 50 of the component 42 when the pads 50 and 60 are juxtaposed. The method includes disposing on either the pads 50 or the pads 60, an array of eutectic solder balls 59 for making a permanent electrical connection therebetween, and processing the electronic device 42 and the board 52 as is typical in the printed circuit assembly art, to re-flow and solidify the solder balls.

Notwithstanding all of the above, the problem has remained to provide for an economical method and structure for supporting and interconnecting electronic devices where a high density of the electronic devices is required. In practice, the prior art has not provided circuit board packages that incorporate more than about 24 layers without prohibitive expense. The prior art has also not provided for desired flexibility in the manufacture of a circuit board package since the boards are typically fabricated remotely from the location at which the boards are assembled with electronic devices and are fabricated with a process that demands mass production. Thence, it has been difficult or impossible to, for example, change a circuit pattern of one of the layers of a circuit board at the printed circuit assembly shop.

Further, solder balls have not been successfully employed to do more than mount a few electronic devices to circuit boards, as illustrated in FIG. 3. One problem has been that solder balls are disposed between the electronic device 42 and the circuit board 52, underneath and out of sight, where the joint formed cannot easily be inspected. Moreover, a single joint cannot be repaired so that, if all of the joints are not formed perfectly, the entire electronic device must be removed and many joints must be disturbed, resulting in high re-work costs. Thence, for any more than a relatively small number of solder balls, joint yield considerations limit the number of solder ball connections that can economically be made.

Figure 4:
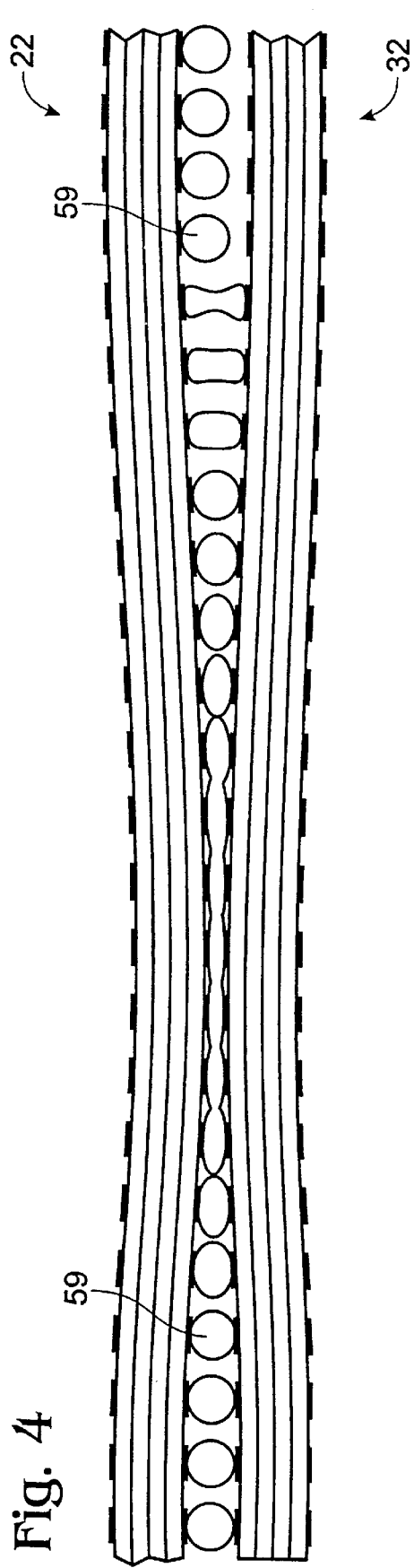
FIG. 4 is a cross section of two multi-layer circuit boards unsuccessfully connected to one another by solder balls shown exaggerated.

Referring to FIG. 4, warpage of either the electronic device 42 and the board 52 may prevent the solder balls 59 from spanning the distance between the electronic device and the board while others will be collapsed to the point of causing a solder short between pads. This has helped to limit the use of solder ball technology to electronic devices 42 that are relatively small in area as compared to the board 52 onto which they are mounted.

Figure 5:
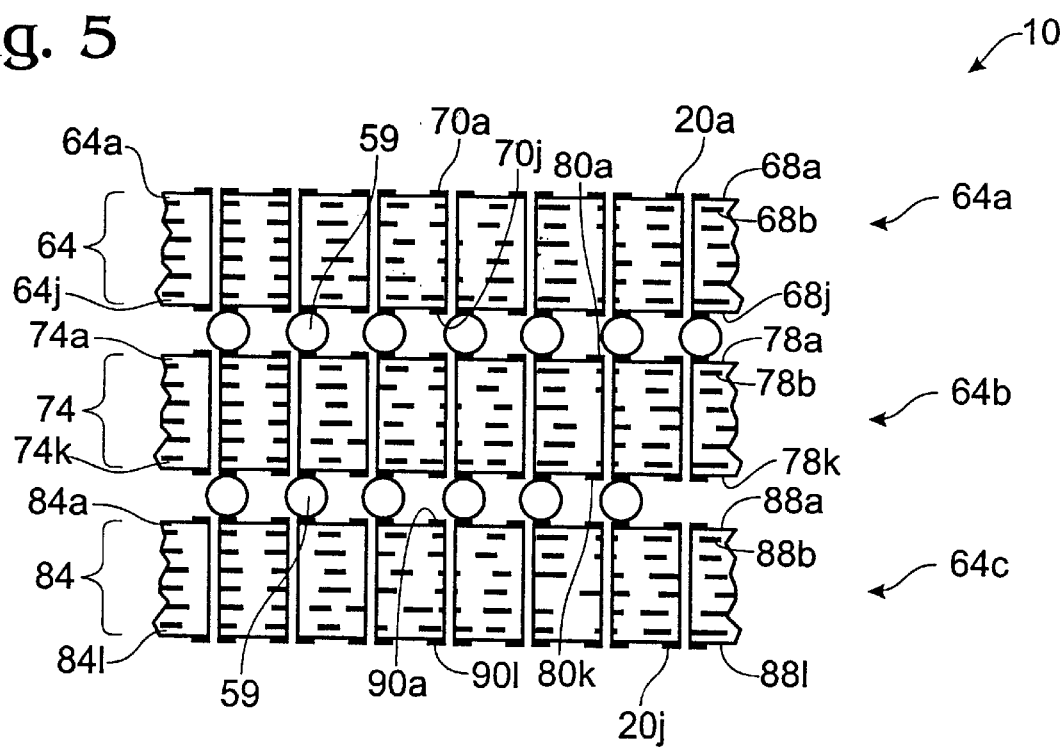
FIG. 5 is a cross section of a first multiple board package employing solder balls according to the present invention having at least three multi-layer circuit boards.

Turning now to FIG. 5, a first embodiment of a multiple board package 10 employing solder balls 59 according to the present invention includes three or more circuit boards 64 comprising boards 64a, 64b, 64c . . . 64n, where n is equal to the total number of the circuit boards 64. The package 10 is particularly advantageous for multi-layered circuit boards 64, each having a plurality of layers and associated circuit patterns and pads as described in connection with FIG. 1; however, the boards 64 may have only a single layer without departing from the principles of the invention.

For purposes of illustration, the board 64a includes individual layers 64 of fiberglass substrate material: 64a, 64b, . . . 64j, where j is equal to the total number of layers in the board 64a, the layers being laminated together as aforedescribed. Each layer 64 includes on at least one side of the layer an associated circuit pattern 68, respectively referenced 68a, 68b, . . . 68j. The circuit patterns have an associated plurality of interconnect pads 70, respectively referenced 70a, 70b, . . . 70j. After lamination, the board 64a is drilled through at selected locations which intercept selected pads 70 of one, two or more of the layers.

Similarly, the board 64b includes individual layers 74 of fiberglass substrate material: 74a, 74b, . . . 74k, where k is equal to the total number of layers in the board 64b, the layers being laminated together as aforedescribed. Each layer 74 includes on at least one side of the layer an associated circuit pattern 78, respectively referenced 78a, 78b, . . . 78j. The circuit patterns have an associated plurality of interconnect pads 80, respectively referenced 80a, 80b, . . . 80j. After lamination, the board 64b is drilled through at selected locations which intercept selected pads 80 of one, two or more of the layers.

Similarly, the board 64c includes individual layers 84 of fiberglass substrate material: 84a, 84b, . . . 84l, where 1 is equal to the total number of layers in the board 64c, the layers being laminated together as aforedescribed. Each layer 84 includes on at least one side of the layer an associated circuit pattern 88, respectively referenced 88a, 88b, . . . 88j. The circuit patterns have an associated plurality of interconnect pads 90, respectively referenced 90a, 90b, . . . 90j. After lamination, the board 64c is drilled through at selected locations which intercept selected pads 90 of one, two or more of the layers.

A bottom-most circuit pattern 68j of the board 64a is adapted so that the associated pads 70j are disposed so as to interconnect with the pads 80a of a top-most circuit pattern 78a of the board 64b when the circuit pattern 68j is juxtaposed with the circuit pattern 78a. Similarly, a bottom-most circuit pattern 78k of the board 64b is adapted so as to interconnect with the pads 90a of a top-most circuit pattern 88a of the board 64c when the circuit pattern 78k is juxtaposed with the circuit pattern 88a.

With the boards 64a, 64b, 64c confronting one another as aforedescribed and illustrated in FIG. 5, a predetermined number of the solder balls 59 are distributed among either the pads 70j or 80a, and 80k or 90a (associated "pairs of pads"), so that, preferably, one solder ball 59 is associated with each of the pairs of pads. Preferably, the solder balls are temporarily affixed to the selected pads by screening an solder paste 61 on the pads and attaching a solder ball 59 to the solder paste 61 which is associated with the pair of pads which it is desired to interconnect.

One of the boards 64 may be advantageously provided as having one of a number of alternative circuit routing patterns, so that the board may be removed from the package 10 and replaced with a board having such an alternative pattern in the printed circuit assembly shop; or a number of variations of the package 10 may be built and their performance characteristics compared.

Referring to FIG. 6, two or more of the boards 64 may also be spaced apart from one another by spacers 99. The spacers include another circuit board 101 having corresponding pads 103 on both sides thereof and an additional layer of the solder balls 59 disposed on the pads on one or both sides of the board. Where solder balls are disposed on both sides of the board 101 of the spacer 99, solder balls may be omitted from the pads on the corresponding, adjacent, circuit board 64. Where the spacers 99 are employed to provide for spacing for electronic devices mounted between the boards, the package 10 may be formed to approximate a three-dimensional, e.g., cubic configuration rather the traditional two-dimensional, planar configuration.

Figure 7:
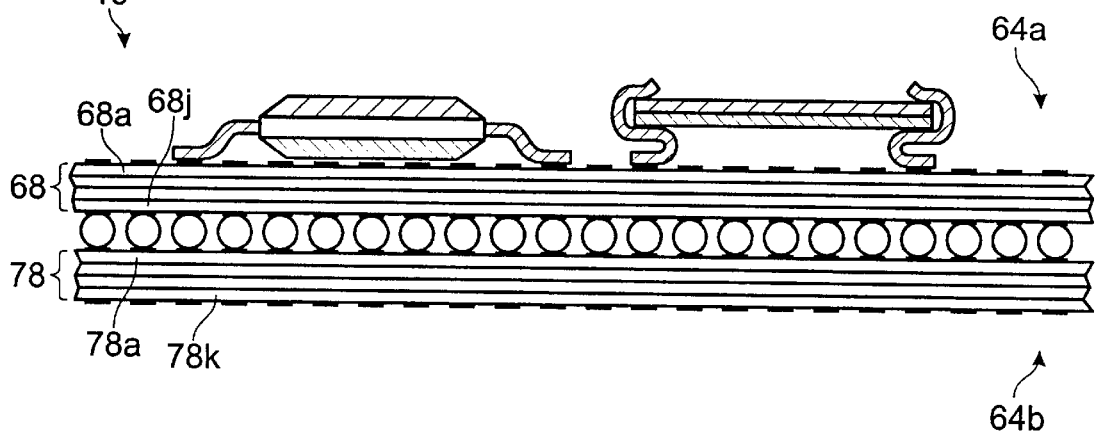
FIG. 7 is a cross section of a second multiple board package employing solder balls according to the present invention having at least two electronic devices on a first multi-layer circuit board and interconnected by a second multi-layer circuit board.

Referring to FIG. 7, an alternative configuration of the package 10 according to the present invention employs just two of the circuit boards 64, e.g., 64a and 64b, the package being adapted through the circuit patterns 68a . . . 68j, and 78a . . . 78k to interconnect two or more individual electronic devices 42 mounted on one, the other or both of the boards. As in the first embodiment, the boards 64 provide a multi-board interconnection package for the electronic devices 42, overcoming the aforedescribed difficulties in the prior art.

The package 10 is made possible as a result of solving some of the problems that have plagued the prior art. In particular, two features of the present method are directed to solve the problem of uneven spacing between the boards. Another feature of the invention is directed to solving the problem of providing sufficiently high joint yield to allow for the formation of a large number of successful solder joints with solder balls. Yet another feature of the invention is directed to solving the problem of aligning and fixing the structure 10 so that the pads of adjacent boards are accurately registered and spaced with respect to one another during the soldering process. These features will be described in more detail below.

Figure 8:
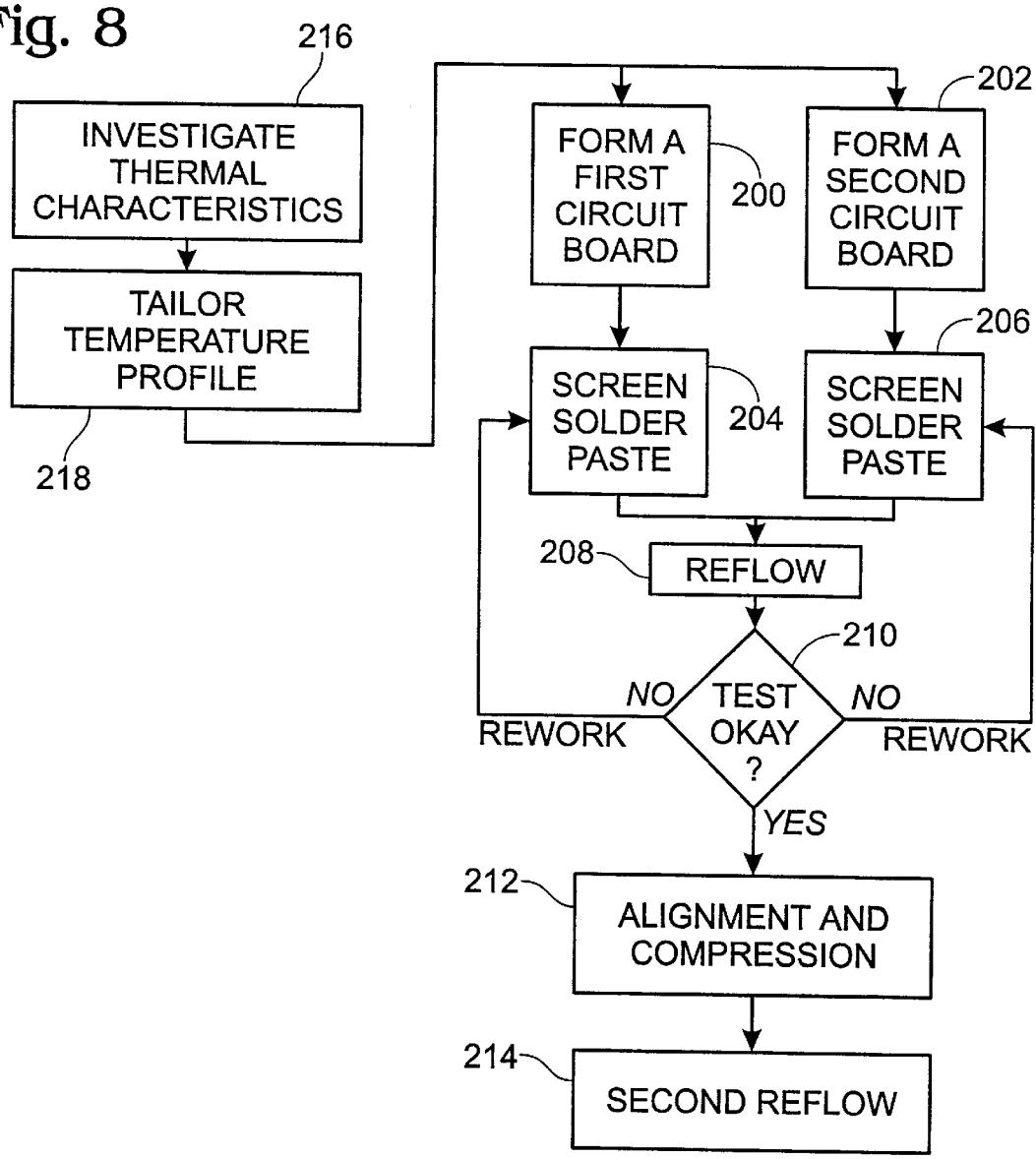
FIG. 8 is a flow chart of a method for fabricating a multiple board package employing solder balls according to the present invention.

An overview of a preferred method according to the present invention for forming the package 10 incorporating the above features is illustrated in FIG. 8. The method described in brief includes a step 200 of forming a first circuit board by conventional techniques, and a step 202 of forming a second circuit board also by conventional techniques. Subsequently, the boards may or may not be loaded, fully or partially, with electronic devices. The method further includes a step 204 of screening a solder paste onto selected pads of the circuit pattern of one of the boards, and a step 206 of attaching a corresponding number of solder balls to the solder paste as is known in the art.

The method still further includes screening a solder paste onto the corresponding pads of the other board. In a re-flow step 208, the boards are heated until the solder on both of the boards re-flows. The re-flowed surfaces are inspected in a step 210 and rework is performed if necessary so that the re-flowed surfaces indicate an acceptable degree of wetting of the pads.

In a board alignment and compression step 212, the boards are placed into an alignment fixture which is described below. The alignment fixture holds the boards in alignment and presses the boards together to hold the package 10 together in preparation for a second re-flow and solidification step 214 to form solder joints between the boards, thereby forming the multi-board package 10. The method includes a step 216 of investigating the thermal characteristics of the package 10 and a step 218 of tailoring the temperature profile thereto, prior to processing of production packages 10. Each of these processes will be described in greater detail below. However, it should be understood that it is not necessary to employ all of the features and steps of the invention to realize significant advantages.

The method is particularly well adapted for soldering large numbers of solder balls, allowing for high density packages 10. Such packages may assume a more three-dimensional configuration than has been provided in the prior art, and may even be formed as cube forms rather than as plane forms to achieve greater package densities, as illustrated in FIG. 7A. Especially in such a configuration, it is difficult to provide heating to the solder balls that are most distant from the source of heating employed in the heating process. The temperature profile of the package 10 must be adjusted accordingly, preferably by constructing a thermally equivalent "dummy" of the package 10 having various locations therewithin equipped with thermocouples adapted to provide the temperature at the location, and adjusting pre-heating and heating profiles to achieve as fast and as even a heating as is practical. It is also preferable to employ a medium having a high heat capacity and a high coefficient of heat transfer. It has been found that FLUORINERT, a trademark of the 3M Company of Minnesota, provides good results at the selected temperature; however, IR or gas-convection heating may be employed without departing from the principles of the invention.

Figure 9:
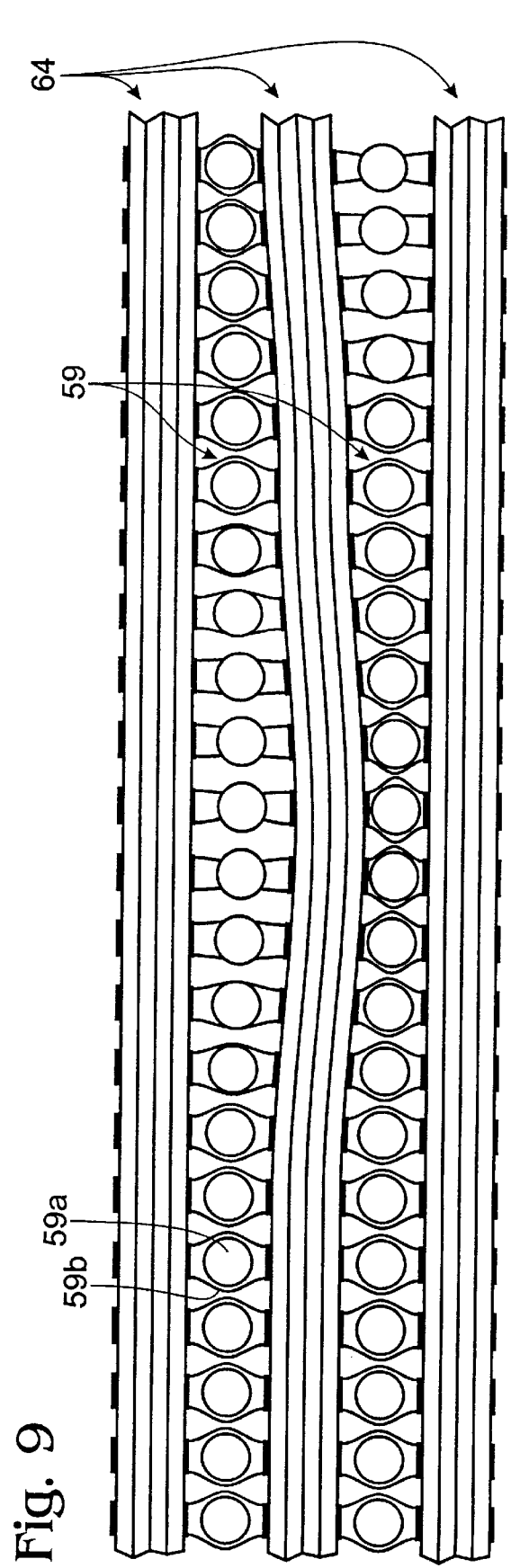
FIG. 9 is a cross section of a portion of three multi-layer boards successfully connected together by solder balls according to the present invention.

The result of employing the method of FIG. 8 is shown in FIG. 9, where it can be seen that all of the solder balls make connection between the associated pairs of pads, and none of the solder balls are displaced so as to wick over to adjacent pads and form a solder bridge.

With particular reference to FIG. 9, and with regard to the problem of uneven spacing, a first feature of the invention provides a solder ball structure that controls collapse of the solder balls so that adjacent of the boards 64 are maintained at a fixed distance from one another. The package 10 employs solder balls 59 having a high melting point core 59a and a low melting point solder exterior 59b. The temperature at which the solder 59b melts is selected in conjunction with the temperature employed by the printed circuit assembly shop or other site of fabrication used to solder electronic devices to boards. The temperature may be selected in light of the manner of heating and the heat transfer medium employed, such as the aforedescribed FLOURINERT medium.

The high melting point core 59a of the solder ball 59 prevents collapse of the solder ball during melting of the low melting point exterior beyond the height provided by the size of the core. Thence, the high melting point core 59a provides for minimum predetermined spacing between the boards, while pressure applied as explained hereafter establishes a maximum predetermined spacing between the boards.

Solder balls 59 having a high-melting point core are provided in the art, such as solder coated copper balls manufactured by Brush Wellman of Pennsylvania. Alternatively, the core 59a may be formed of any other material that does not melt at the melting temperature of the exterior 59b, such as ceramic.

Figure 10:
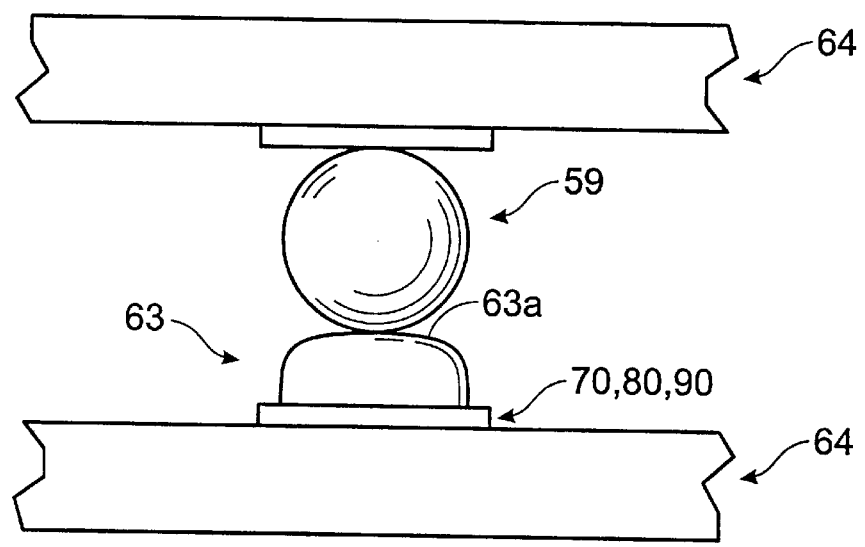
FIG. 10 is a cross section of a solder joint employing a solder ball and pedestal according to the present invention.

Referring to FIG. 10, as another feature of the present invention directed to the problem of uneven spacing, a low melting point solder pedestal 63 is provided on one of the pads of the pair of pads which the solder ball is employed to electrically join. The low-melting point solder pedestal provides additional reach between the boards to assist the solder ball in connecting therebetween. The pedestal 63 is preferably substantially hemispherically shaped so that it extends above the board to provide a pedestal function. This shape may be naturally achieved by re-flow of a solder paste placed on the pad. It has been found that, by providing the pedestal 63 in conjunction with the aforedescribed hard cored solder ball 59, there is a decreased tendency, for the same total quantity of solder, for forming solder bridges. The pedestal is also preferably leveled at a top portion 63a thereof for a reason to be described below.

Figure 11:
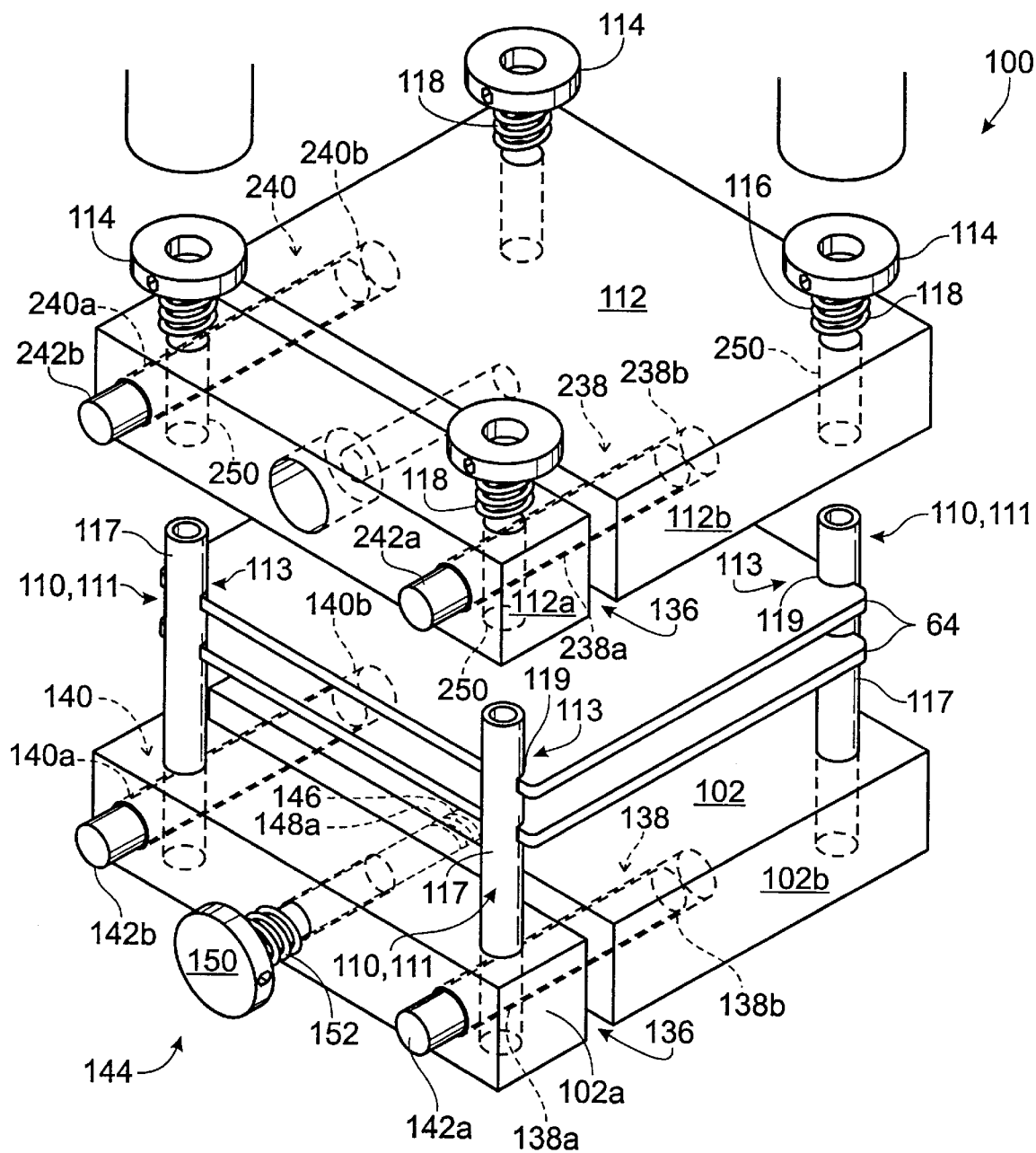
FIG. 11 is a pictorial view of a fixture for fabricating a multiple board package employing solder balls according to the present invention.
Figure 12:
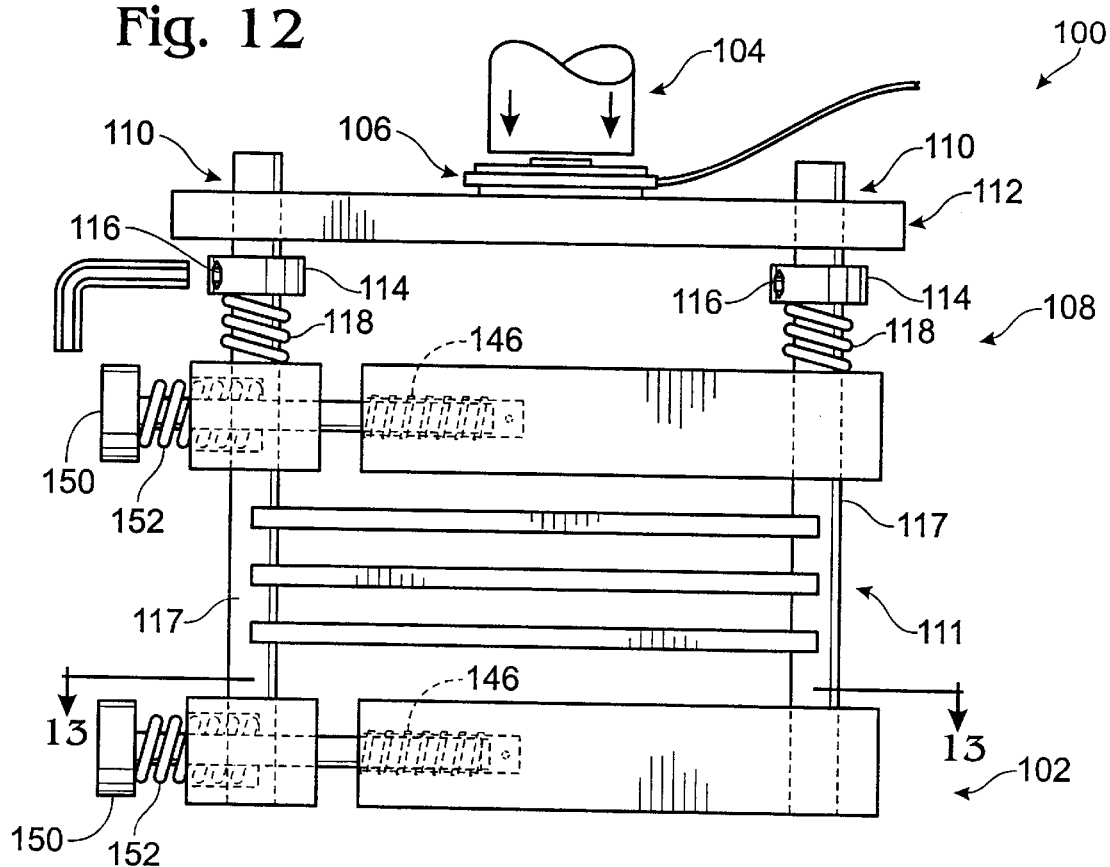
FIG. 12 is a first side elevation of the alignment fixture of FIG. 9.
Figure 13:
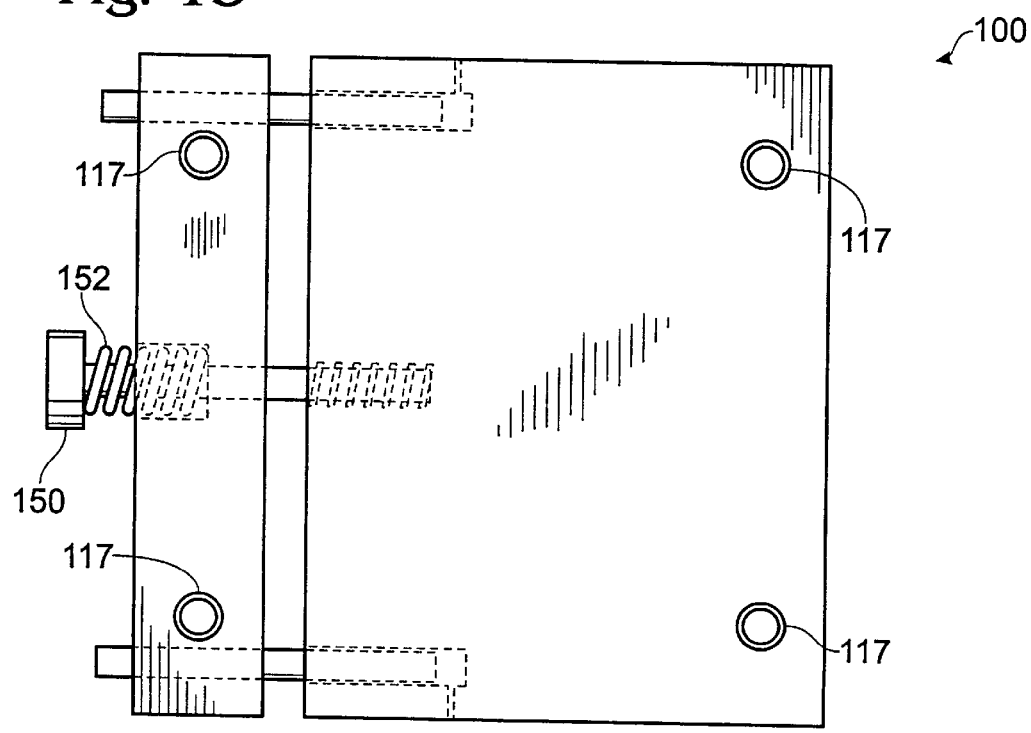
FIG. 13 is a cross section of the alignment fixture of FIG. 9, taken along line 13—13 of FIG. 12.

Referring particularly to FIGS. 11–13, the invention further accommodates any unevenness in the spacing between the boards by providing an alignment fixture 100. The alignment fixture 100 provides for pressing the boards 64 against one another with a predetermined amount of force, so as to conform any curvatures in the boards 64 so that the spacing therebetween is ideally substantially equal to the diameters of the cores 59a of the solder balls. As a practical matter, the force ensures that there is a predetermined maximum space between the boards while the cores ensure that there is a predetermined minimum space between the boards.

The fixture 100 includes a base 102 for receiving the bottom surface of a bottom-most of the boards 64, a force-applying means 104 for applying a desired load to a top surface of a top-most of the boards 64, a load cell 106 for measuring the load, and a locking means 108 for maintaining the load at a desired value. The locking means 108 preferably includes compression posts 110 extending upwardly from the base 102, through a cover plate 112, and adjustable collars 114 adapted to fit around the posts 110, over the cover plate 112. The collars include set-screws 116 or other locking mechanisms for locking the collars to the posts. The collars overlap and retain coil extension springs 118 which bias the cover plate 112 toward the base 102. Adjusting and locking the position of the collars 114 on the posts 110 compresses the springs 118 an adjustable amount, to achieve the desired load, and locking the collars maintains the load throughout subsequent processing with the fixture 100. Other features of the alignment fixture 100 are described below.

The invention advantageously provides a sufficiently high joint yield as to make large numbers of solder ball joints practical, by providing for a visual indication of the capability of each pair of pads to be joined by a solder ball to accept wetting by solder before the boards are joined. Solder is applied, in the form of the solder ball 59 and the pedestal 63, to respective pads of the pair of pads which it is desired to join. Each is then re-flowed, whereafter the surface of the pad is visually examined, preferably by a computerized vision system. It has been found that it is easy to discern by such visual inspection whether the joint will be good or not and if it appears not, it is relatively easy to re-work the boards at this point. Without this visual indication, oxides, debris or other blemishes on the pads which would prevent a good or successful solder joint have often gone undetected, ruining the economy of the method for large numbers of joints.

In addition to the above, the invention provides for improved alignment of the boards 64, and of the solder balls to the boards, for achieving optimum yields in the joining of the boards. Referring again to FIGS. 11–13, the alignment fixture 100 includes alignment members 111 disposed on the base 102, for engaging cooperating associated alignment elements 113 on the boards 64. Preferably, the alignment members 111 include a corresponding four precision located cylindrical pins 117 projecting perpendicularly from the base 102. Then, the alignment elements 113 are preferably corresponding round concavities 119 in the edges of the boards 64, the concavities having diameters substantially matching the diameters of the corresponding pins.

In FIGS. 12 and 13, the alignment elements 111 are illustrated as being employed as the aforedescribed posts 110, for convenience. However, it is sometimes preferable that the posts 110 be separate elements from the alignment elements 111, as will be immediately appreciated by one of ordinary skill in the mechanical arts.

The bed 102 is formed to be a stable platform for maintaining the dimensional tolerances of the alignment members during a process heating cycle that raises the temperature of the fixture from ambient to the melting temperature of the solder balls 59, for re-flowing the solder balls to connect the boards 64. The bed must also accommodate adjustment of the distance between the alignment members for different size boards 64. Advantageously, the bed is formed monolithically and bore holes 138, 140 are drilled laterally therethrough, the bore holes having an axis that is perpendicular to the pins 114 and parallel to each other. The bed 102 is then cut along a plane 136 that divides the bore holes, to form two portions 102a, 102b of the bed. This provides for precision alignment of the corresponding halves 138a, 138b of the bore hole 138, and 140a, 140b of the bore hole 140. Precision fitted lateral slides 142a, 142b are slidably received by the bore holes 138, 140, respectively. The slides 142 are adapted so as to be longer than the depth of the bore holes to permit the portions 102a, 102b to slide away from one another, to accommodate different sized boards 64 between the pins 114.

The cover plate 112 is formed similarly to the bed 102. The cover plate includes pin receiving holes 250 for slidably receiving the pins 114. Advantageously, the cover plate is formed monolithically and bore holes 238, 240 are drilled laterally therethrough, the bore holes having an axis that is perpendicular to the pins 114 and parallel to each other. The cover plate 112 is then cut along the plane 136 that divides the bore holes, to form two portions 112a, 112b of the cover plate. This provides for precision alignment of the corresponding halves 238a, 238b of the bore hole 238, and 240a, 240b of the bore hole 240. Precision fitted lateral slides 242a, 242b are slidably received by the bore holes 238, 240, respectively. The slides 242 are adapted so as to be longer than the depth of the bore holes to permit the portions 112a, 112b to slide away from one another, to accommodate, in cooperation with the bed 102, different sized boards 64 between the pins 114.

A means 144 for drawing the portions 102a, 102b and 112a, 112b together with a predetermined force is provided, to maintain alignment of the boards 64 during the aforedescribed heating cycle. Preferably, the means 144 includes a depth adjustment screw 146, slidably received in either or both the portion 102a of the bed 102 and 112a of the cover plate 112, as shown in FIG. 12, the former only being illustrated in FIG. 11 and subsequently discussed for convenience. The screw 146 is threadably received at a distal end thereof in a cooperating threaded bore 148a in the portion 102b of the bed. The depth adjustment screw includes, at a proximal end thereof, a handle 150 for turning the screw. The bed portion 102a is spring biased toward the bed portion 102b with a coil extension screw 152 disposed between the handle 150 and the bed portion 102a.

Alignment is still further enhanced in the present invention by the aforedescribed leveling of the pedestals 63. Thence, a solder ball that is not perfectly aligned with the pedestal 63 still finds a relatively level surface upon which to rest, preventing slippage and movement of the solder ball with respect to the pedestal 63. This further assures that the solder ball will connect to the associated pads and be prevented from causing a solder short.

The alignment and compressive force provided by the fixture 100 provide, along with all of the aforedescribed preferred features as well as judicious control of processing parameters as exercised by one of ordinary skill in the art as informed by the foregoing description, a reliability in solder ball joint connectivity that has not before been available. This results in the ability to join circuit boards together, especially large, multi-layer circuit boards, without requiring the specialized and expensive operations of a printed circuit board fabrication shop, to achieve outstanding cost advantages in high volume production. On the other hand, this also allows for quickly and easily changing the pattern of electrical interconnection of electronic devices soldered to a standard printed circuit board, for prototyping and other low volume applications. For example, as previously mentioned, one of the boards may be employed as an easily exchangeable or test routing pattern, so that electronic devices that are already partially electrically connected may be completely electrically interconnected in varying ways without incurring high cost or long lead times.

It is to be emphasized that, while a specific method and apparatus providing a multiple board package employing solder balls has been shown as preferred, other configurations could be utilized, in addition to configurations already mentioned, without departing from the principles of the invention. In particular, any number of boards may be connected in addition to those mentioned, and any number of additional electronic devices may be installed on one or more of the boards, on either side of the board or boards. The solder balls may be applied to the circuit pattern of any board in a regular pattern, a random pattern, or any other pattern that is desired, and the pattern of solder balls employed for one circuit pattern may vary from the pattern employed for another circuit pattern. Further, the boards 64 may employ any circuit pattern on either or both sides of the board, and the circuit pattern of one of the boards 64 may be the same as, or may advantageously vary from the circuit patterns of an adjacent board.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

We claim:

1. An apparatus for assembling a multiple circuit board package, comprising:

a first base member;

a first alignment member fixedly attached and substantially perpendicular to said first base member;

a second base member movably connected to said first base member;

a second alignment member fixedly attached and substantially perpendicular to said second base member, said first alignment member and said second alignment member being adapted to receive and align a plurality of circuit boards; and a first force producing device for urging said second base member toward said first base member so as to register corresponding portions of said circuit boards with one another.

2. The apparatus of claim 1, wherein said first force producing device is coupled to said second base member through a spring.

3. The apparatus of claim 1, further comprising a second force producing device for applying a force on said plurality of circuit boards toward said base member.

4. The apparatus of claim 1, wherein said first and second alignment members each comprise a plurality of columns for engaging edges of said circuit boards.

5. The apparatus of claim 4, wherein said columns have substantially circular surfaces for engaging said edges of said circuit boards.

6. A multiple circuit board package, comprising:
a first multi-layered circuit board having a circuit pattern including a plurality of interconnection pads and connected by vias to a plurality of circuit layers within said first circuit board;
a second multi-layered circuit board having a circuit pattern including a plurality of interconnection pads and connected by vias to a plurality of circuit layers within said second circuit board;
an intermediate multi-layered circuit board disposed between said first circuit board and said second circuit board, said intermediate circuit board having a first side disposed adjacent said circuit pattern of said first circuit board, said first side having a circuit pattern including a plurality of interconnection pads corresponding to said interconnection pads of said first circuit board, and a second side disposed adjacent said circuit pattern of said second circuit board having a circuit pattern including a plurality of interconnection pads corresponding to said interconnection pads of said second circuit board, said circuit pattern of said first side of said intermediate circuit board and said circuit pattern of said second side of said intermediate circuit board being connected by vias to a plurality of circuit layers within said intermediate circuit board; and
a plurality of solder balls having a high melting point core and a low melting point solder exterior, said solder balls being disposed between selected interconnection pads of said first circuit board and of said first side of said intermediate circuit board, and between selected interconnection pads of said second circuit board and of said second side of said intermediate circuit board, so as to interconnect multiple layers of said first, second and intermediate circuit boards.

7. The circuit board package of claim 6, wherein said core of said solder balls comprises a substance other than solder.

8. The circuit board package of claim 6, wherein said core comprises copper.

9. The circuit board package of claim 6, wherein said core of said solder balls comprises a non-metallic material.

10. The circuit board package of claim 9, wherein said core comprises ceramic.

11. A method for fabricating a multiple circuit board package, comprising:
providing a first circuit board having a first circuit pattern formed on a first side thereof, said first circuit pattern having a plurality of first interconnection pads;
providing a second circuit board having a second circuit pattern formed on a first side thereof, said second circuit pattern having a plurality of second interconnection pads corresponding to said first interconnection pads;
attaching to said first interconnection pads a corresponding plurality of solder balls having a high melting point core and a low melting point solder exterior;
placing said first side of said first circuit board adjacent said second side of said second circuit board so that said first interconnection pads register with said corresponding second interconnection pads;
while applying sufficient heat to cause said low melting point solder to melt, applying a force to said first and second circuit boards to ensure that the spacing between said first and said second interconnection pads does not exceed a predetermined maximum, said cores of said solder balls ensuring that said spacing is no less than a predetermined minimum; and
after said heat is applied while said force is still applied, allowing said low melting point solder to cool so as to form solid connections between respective interconnection pads.

12. The method of claim 11, wherein said core of said solder balls comprises a substance other than solder.

13. The method of claim 12, wherein said core comprises copper.

14. The method of claim 12, wherein said core of said solder balls comprises a non-metallic material.

15. The method of claim 14, wherein said core comprises ceramic.

16. The method of claim 11, further comprising the step of applying a low melting point solder to said second interconnection pads so as to form pedestals thereon.

17. The method of claim 16, further comprising attaching said solder balls to said interconnection pads of said first circuit board by applying a older paste onto said interconnection pads of said first circuit board, attaching said solder balls to said interconnection pads of said first circuit board temporarily using said solder paste, and applying heat for a sufficient time to wet said interconnection pads of said first circuit board with said low melting point solder exterior of said solder balls to bond said solder balls to said interconnection pads of said first circuit board.

18. The method of claim 16, further comprising applying lateral pressure to said first and second circuit boards to force said circuit boards against an alignment member and thereby facilitate registration of said first interconnection pads with said corresponding second interconnection pads.

19. The method of claim 18, further comprising providing said first and second circuit boards with at least one alignment element for engaging said alignment member.

20. The method of claim 19, wherein said alignment element comprises a plurality of concavities in the edges of said first and second circuit boards, and said alignment member comprises a plurality of posts fixedly mounted perpendicular to said first and second circuit boards for engaging respective said concavities.

21. The method of claim 20, wherein said concavities and said posts have substantially circularly shaped respective engagement surfaces.

22. A multiple circuit board package, comprising:
a first circuit board having a circuit pattern including a plurality of interconnection pads and a plurality of individual electronic devices mounted on said board and electrically connected to said interconnection pads
a second circuit board having a circuit pattern, wherein selected interconnection pads of said first circuit board are disposed adjacent a plurality of corresponding interconnection pads of said second circuit board; and
a plurality of solder balls having a high melting point core and a low melting point solder exterior, said solder balls being disposed between selected interconnection pads of said first circuit board and said second circuit board for completing a desired electrical connection between one or more of said individual electronic devices and another of said electronic devices, said high melting point cores of said solder balls ensuring a minimum spacing between said first and said second circuit boards when a force is applied to said circuit boards for flattening the circuit boards to ensure that said low melting point solder exterior of said solder balls is enabled to attach to said selected interconnection pads.

23. The circuit board package of claim 22, wherein at least one of said first and second circuit boards comprises a multi-layered circuit board.

24. The circuit board package of claim 22, wherein one of said first or second circuit boards includes an opposing circuit pattern formed on an opposing side thereof, connected to the circuit pattern on the first side thereof and having a plurality of opposing interconnection pads, said circuit package further comprising a third circuit board having a third circuit pattern formed on one side thereof adjacent said opposing circuit pattern and having a plurality of third interconnection pads corresponding to said opposing interconnection pads, said third circuit pattern being adapted to connect to one another pads on said third circuit board whose corresponding opposing interconnection pads are not connected to one another, and a plurality of solder balls having a high melting point core and a low melting point solder exterior, said solder balls being disposed between and attached to said opposing interconnection pads and said third interconnection pads so as to connect one or more of said opposing circuit pads with one another.

25. The circuit board package of claim 22, wherein said plurality of interconnection pads of said first circuit pattern of said first circuit board includes a regular array of interconnection pads, and wherein said corresponding interconnection pads of said circuit pattern of said second circuit board includes a corresponding regular array of interconnection pads.

26. The circuit board package of claim 25, wherein said regular array of interconnection pads of said circuit pattern of said first circuit board extends substantially over the entire surface area of said first circuit board.

27. The circuit board package of claim 26, wherein said regular array of interconnection pads of said circuit pattern of said second circuit board extends substantially over the entire surface area of said second circuit board.

28. The circuit board package of claim 22, wherein said core of said solder balls comprises a substance other than solder.

29. The circuit board package of claim 28, wherein said core comprises copper.

30. The circuit board package of claim 28, wherein said core of said solder balls comprises a non-metallic material.

31. The circuit board package of claim 30, wherein said core comprises ceramic.

* * * * *

UNITED STATES PATENT AND TRADEMARK OFFICE
CERTIFICATE OF CORRECTION

PATENT NO. : 6,043,990
DATED : March 28, 2000
INVENTOR(S) : Morgan T. Johnson and David R. Ekstrom It is certified that error appears in the above-identified patent and that said Letters Patent is hereby corrected as shown below:

Title page,
Delete "BALIS" and insert -- BALLS -- in the title

Column 1,
Line 2, delete "BALIS" and insert -- BALLS -- in the title

Signed and Sealed this

Twenty-fifth Day of December, 2001

Attest:

Attesting Officer

JAMES E. ROGAN
Director of the United States Patent and Trademark Office